(12) United States Patent
Chen et al.

(10) Patent No.: US 9,213,057 B2
(45) Date of Patent: Dec. 15, 2015

(54) TESTING SYSTEM AND TESTING METHOD FOR TOUCH DEVICE

(71) Applicant: MStar Semiconductor, Inc., Hsinchu Hsien (TW)

(72) Inventors: Chien-Chuan Chen, Hsinchu Hsien (TW); Kai-Ting Ho, Hsinchu Hsien (TW); Yu-Chien Huang, Hsinchu Hsien (TW)

(73) Assignee: MStar Semiconductor, Inc., Hsinchu Hsien (TW)

( * ) Notice: Subject to any disclaimer, the term of this patent is extended or adjusted under 35 U.S.C. 154(b) by 208 days.

(21) Appl. No.: 13/962,990

(22) Filed: Aug. 9, 2013

(65) Prior Publication Data

US 2014/0043038 A1    Feb. 13, 2014

(30) Foreign Application Priority Data

Aug. 9, 2012   (TW) .............................. 101128846 A

(51) Int. Cl.
G01R 31/28 (2006.01)
G06F 3/041 (2006.01)
G01R 31/312 (2006.01)

(52) U.S. Cl.
CPC ............ *G01R 31/28* (2013.01); *G01R 31/2829* (2013.01); *G06F 3/0416* (2013.01); *G01R 31/2848* (2013.01); *G01R 31/312* (2013.01)

(58) Field of Classification Search
CPC ........................... G01R 31/28; G01R 31/2829
USPC .................................. 324/658, 672, 674, 679
See application file for complete search history.

(56) References Cited

U.S. PATENT DOCUMENTS 7,663,607 B2 *   2/2010   Hotelling et al. ............. 345/173
2012/0280934 A1 *  11/2012   Ha et al. ........................ 345/174

FOREIGN PATENT DOCUMENTS

CN              102121956 A          7/2011

OTHER PUBLICATIONS

Taiwan Office Action dated Jul. 16, 2014, 6 pages.

* cited by examiner

*Primary Examiner* — Vincent Q Nguyen
(74) *Attorney, Agent, or Firm* — Edell, Shapiro & Finnan, LLC

(57) ABSTRACT

A testing system for a touch device includes a touch simulation module, a control module and a determination module is provided. The touch simulation module includes multiple conductive elements respectively corresponding to multiple touch sensing regions of the touch device. The control module selectively provides a testing signal to one or multiple of the conductive elements. The determination module determines whether the touch device correctly responds a testing that the control module provides to the device under testing through the touch simulation module.

12 Claims, 5 Drawing Sheets

TESTING SYSTEM AND TESTING METHOD FOR TOUCH DEVICE

This application claims the benefit of Taiwan application Serial No. 101128846, filed Aug. 9, 2012, the subject matter of which is incorporated herein by reference.

BACKGROUND OF THE INVENTION

1. Field of the Invention

The invention relates in general to a testing technique, and more particularly, to a technique for testing whether a touch device correctly responds to a user touch.

2. Description of the Related Art

Operating interfaces of recent electronic products have become more and more user-friendly and intuitive as technology advances. For example, via a touch screen, a user can directly operate programs as well as input messages/texts/patterns with fingers or a stylus; in this way, it is much easier to convey demands than operating via traditional input devices such as a keyboard or buttons. In practice, a touch screen usually comprises a touch sensing panel and a display device disposed at the back of the touch sensing panel. According to a position of a touch on the touch sensing panel and a currently displayed image on the display device, an electronic device determines an intention of the touch to execute corresponding operations.

Current capacitive touch control techniques are in general categorized into self capacitive and mutual capacitive types. Self capacitive touch panel, featuring a single electrode structure of a simpler fabrication process and low costs, prevails in entry-level electronic devices.

FIG. 1 shows an exemplary sensing electrode arrangement of a conventional self capacitive touch panel. In a region 100, multiple sensing electrodes (e.g., an electrode 11) having an equal width and each appearing similar to a right-angle triangle are disposed. Each of the sensing electrodes is connected to a sensor (not shown). By applying a user touch, the magnetic line distribution around an electrode is affected to lead to a change in a capacitance value detected by the sensors. According to a position of the sensing electrode with the capacitance value change and an amount of the capacitance value change, a position of the user touch can be estimated.

Due to possible deviations during a fabrication process of sensing electrodes, an actual shape of the sensing electrodes may be identifiably different from an ideal shape. FIG. 2 shows two exemplary errors—a region 12A contains a disconnection, and a region 12B contains a cutaway. These errors degrade the accuracy of sensing results to even cause a misjudgment on a touch position. To prevent the foregoing problems, before being shipped out of the factory, products are required to undergo testings to filter out malfunctioning products.

In general, current testing solutions are manually performed. For example, due to conductivity of metal, a capacitance value detected by a sensor is changed when a metal rod is placed closely above a sensing electrode (e.g., as a position 30 shown in FIG. 3), which is equivalent to a user touch upon the sensing electrode. Theoretically speaking, different placement positions of the metal rod render the sensors to generate different detection results. Thus, by comparing theoretical values of the detection results with actual values, a testing staff may conclude whether the sensing electrodes correctly reflect expected capacitance changes when placing the metal rod at the corresponding position.

Further, in a current testing solution, after confirming that a normal detection result is yielded by a corresponding position tested by the metal rod, a testing staff is required to manually relocate the metal rod to another position to continue the testing procedure. Apparently, with the current testing solution, manufacturers can only randomly test a small part of products with limited human resources. Thus, a testing staff can only test few predetermined positions on touch panels under testing.

SUMMARY OF THE INVENTION

The invention is directed to a testing system and a testing method, which can be designed to be automatic without involving human resources. Compared to a conventional manual testing method, the testing system and the testing method disclosed by the present invention offer outstanding efficiency for a testing range substantially covering all touch sensing regions in a device under testing. Further, by incorporating an appropriately design testing apparatus, relative positions of the testing system and the device under testing can be fixed to yield an accuracy far higher than that yielded by a manually placed metal rod.

According to an aspect of the present invention, a testing system for testing a touch device is provided. The testing system includes a touch simulation module, a control module and a determination module. The touch simulation module includes multiple conductive elements respectively corresponding to multiple touch sensing regions of the touch device. The control module selectively provides a testing signal to one or multiple of the conductive elements. The determination module determines whether the touch device correctly responds to a testing that the control module provides to the device under testing via the touch simulation module.

According to another aspect of the present invention, a testing method for testing a touch device is provided. The method includes steps of: placing a touch simulation module closely to the touch device, wherein the touch simulation module includes multiple conductive elements respectively corresponding to multiple touch sensing regions of the device under testing; performing an auto-testing procedure of selectively providing a testing signal to one or multiple of the conductive elements; and determining whether the touch device correctly responds to the auto-testing procedure.

The above and other aspects of the invention will become better understood with regard to the following detailed description of the preferred but non-limiting embodiments. The following description is made with reference to the accompanying drawings.

DETAILED DESCRIPTION OF THE INVENTION

Figure 1:
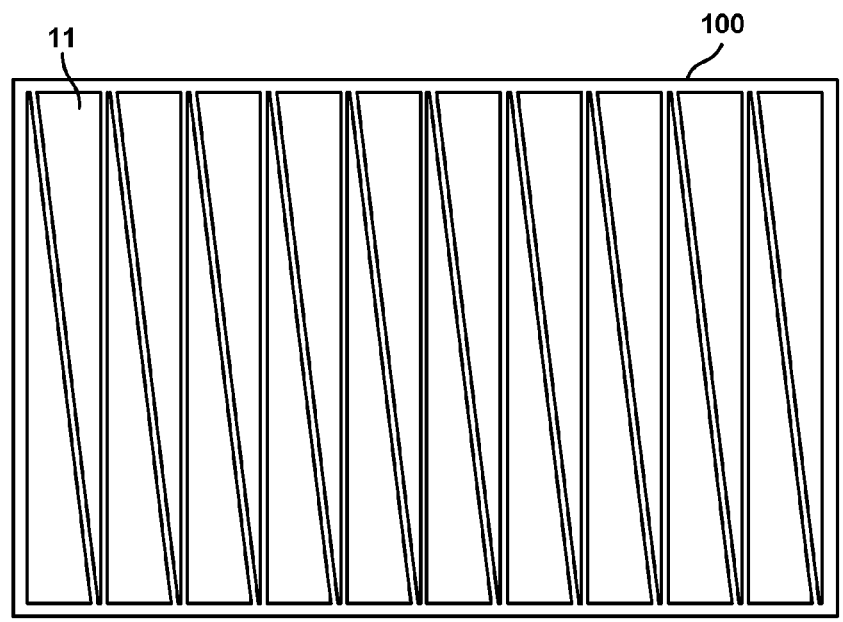
FIG. 1 is an exemplary sensing electrode arrangement of a conventional self capacitive touch panel.
Figure 2:
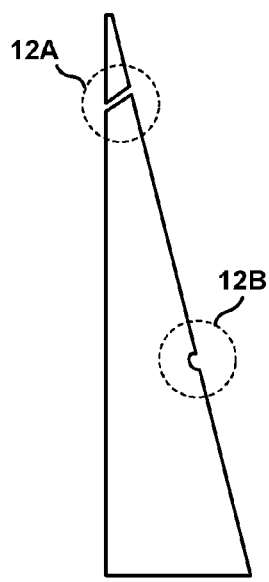
FIG. 2 shows exemplary electrode errors.
Figure 3:
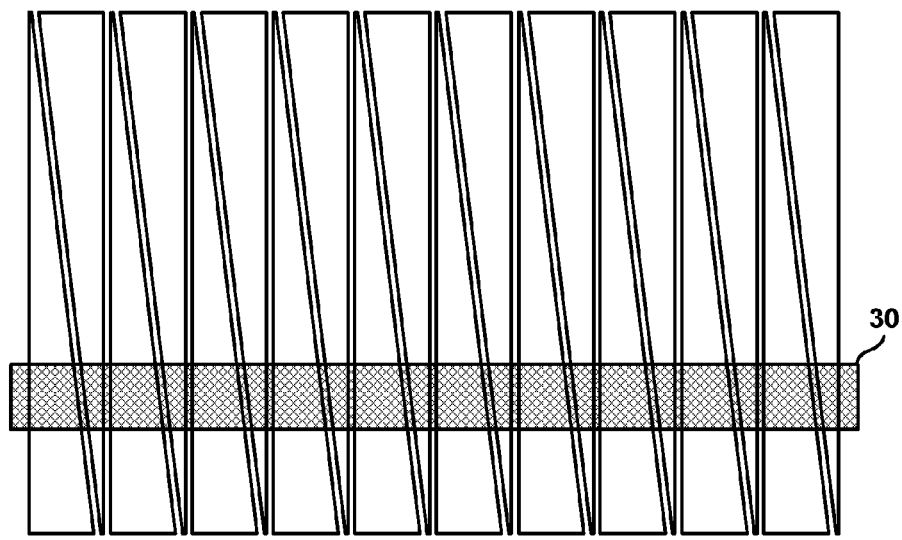
FIG. 3 is diagram of a corresponding relationship between a placement position of a metal rod and sensing electrodes.
Figure 4:
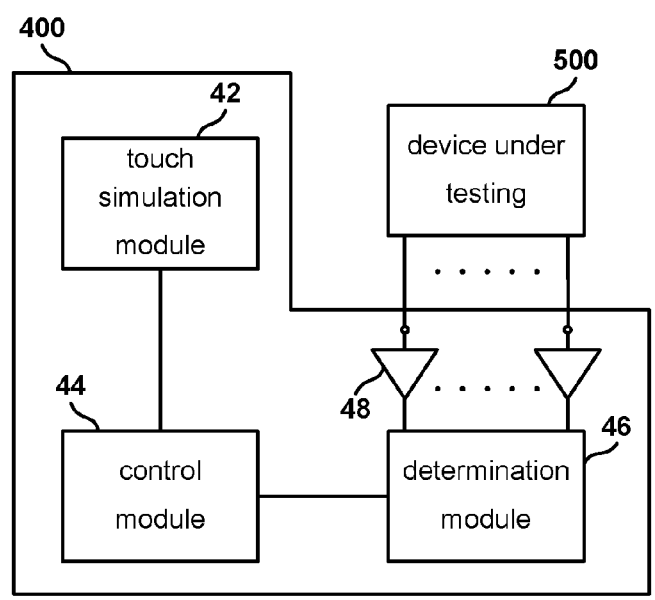
FIG. 4 is block diagram of a testing system according to an embodiment of the present invention.

FIG. 4 shows a testing system 400 according to an embodiment of the present invention. Referring to FIG. 4, the testing system 400 includes a touch simulation module 42, a control module 44, a determination module 46 and multiple sensors 48. The testing system 400 is for testing whether a device 500 under testing correctly responds to a user touch. In practice, the device 500 under testing may be an independently functional electronic device, or a part of an electronic touch device such as a touch panel or a sensing electrode layer in a self capacitive touch panel. The device 500 under testing may include multiple touch sensing regions, which may be formed by the sensing electrodes. It should be noted that, the external sensors 48 are optional elements of the testing system 400. If the device 500 under testing is built-in with a sensor, instead of a detection result generated by the additionally provided sensors 48, the determination module 46 may directly receive a detection result generated by the built-in sensor of the device 500 under testing. With the device 500 under testing exemplified by the conventional sensing electrode layer in FIG. 1, details of the testing system 400 according to an embodiment of the present invention are described below.

Figure 5A:
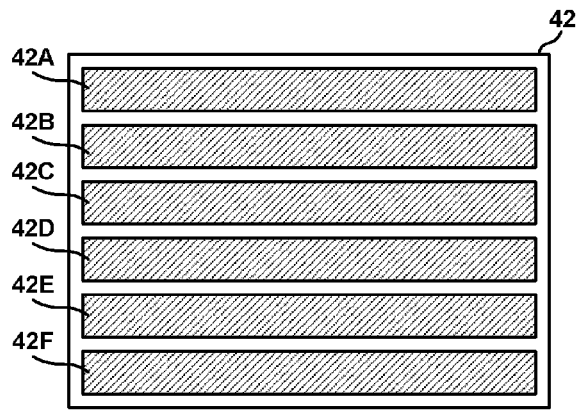
FIG. 5A is a touch simulation module in a testing system according to an embodiment of the present invention.
Figure 5B:
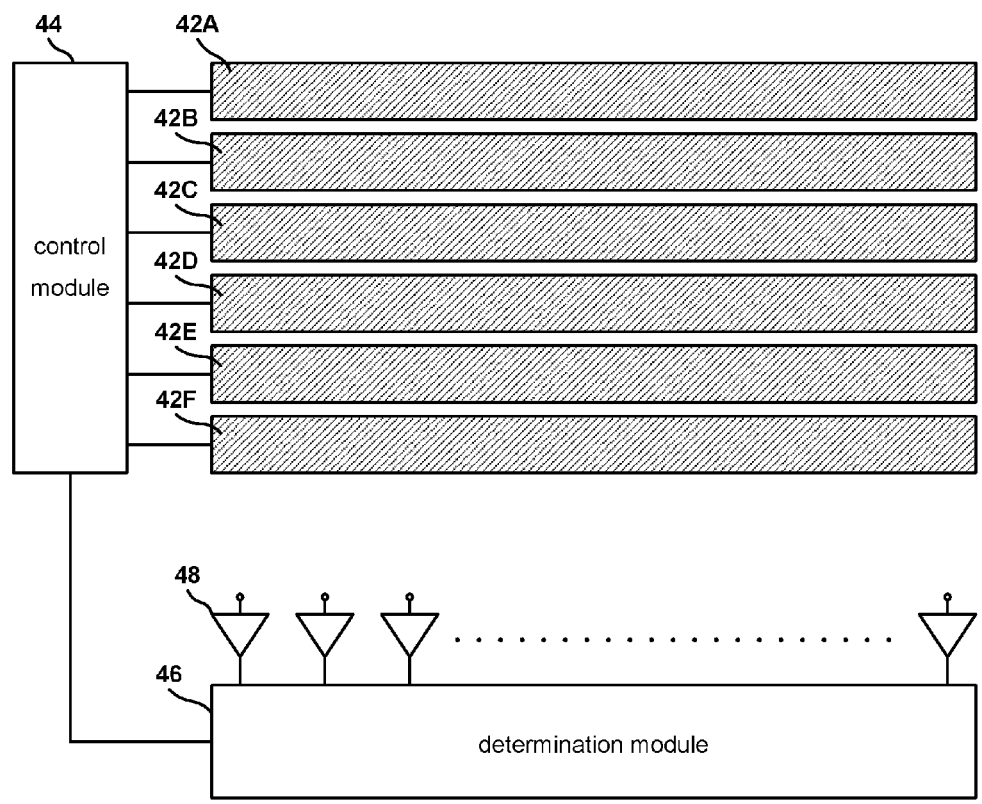
FIG. 5B shows detailed circuit connections in a testing system according to an embodiment of the present invention.
Figure 5C:
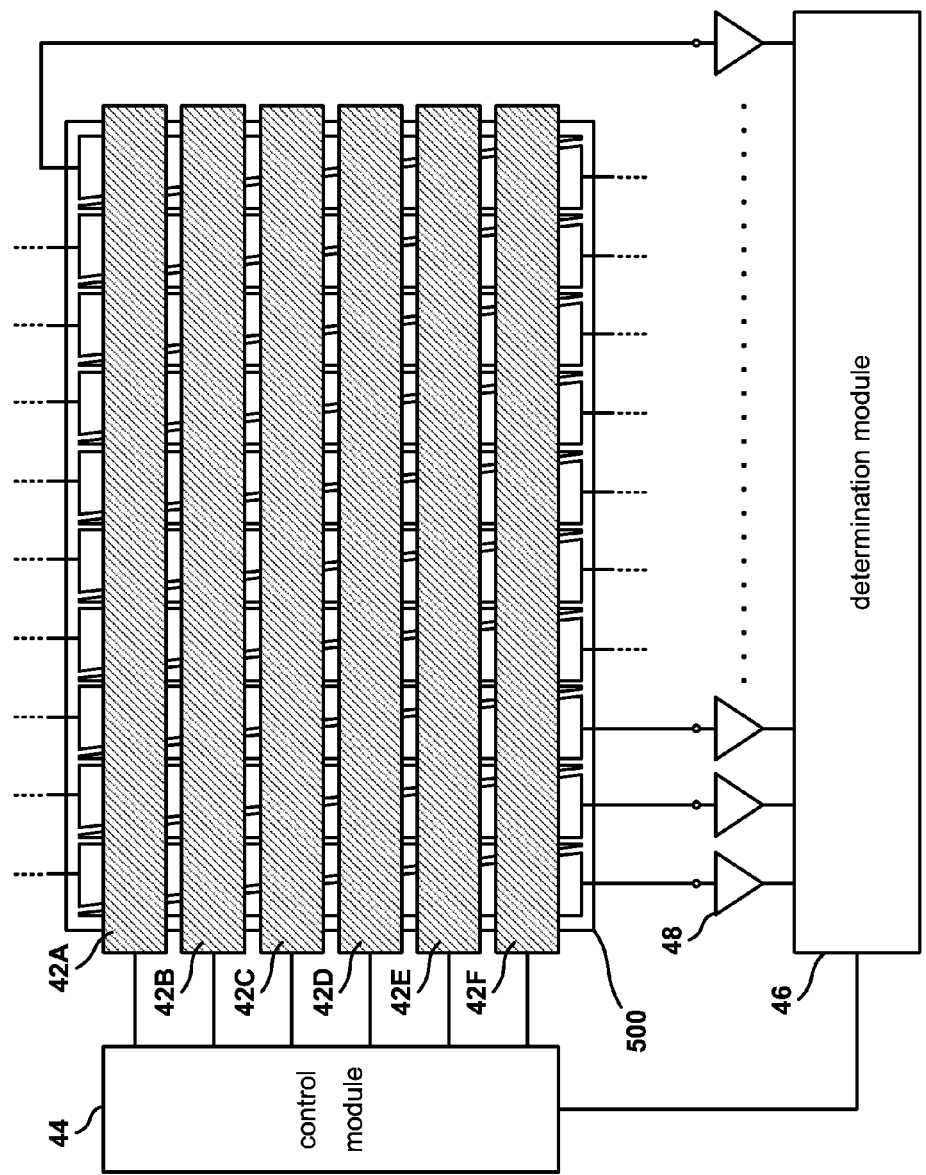
FIG. 5C shows arrangement relations between a testing system and a device under testing during a testing procedure.

As shown in FIG. 5A, six strip-like conductive elements 42A to 42F are disposed on a surface of the touch simulation module 42 of the embodiment. In practice, the conductive elements 42A to 42F may be formed by a material having satisfactory conductivity, such as copper. As shown in FIG. 5B, the conductive elements 42A to 42B are respectively connected to the control module 44. FIG. 5C shows a schematic diagram depicting an arrangement between the testing system 400 and the device 500 under testing during a testing procedure.

In the device 500 under testing, each of the triangular sensing regions is connected to a sensor 48 (connecting wires between the electrodes and the sensors 48 are partially omitted for a clear illustration). The sensing electrodes have a planar shape similar to a scalene triangle, and a vertex and a base arranged in a staggered arrangement on a plane. A shortest side of each of the sensing electrodes is parallel to a predetermined direction. The conductive elements 42A to 42F are multiple strip-like conductive plates disposed in parallel.

When the touch simulation module 42 is placed closely to the device 500 under testing to perform the testing procedure, the strip-like conductive plates 42A to 42F are also parallel to the predetermined direction.

As seen from FIG. 5C, each of the conductive elements 42A to 42F crosses over all of the triangular electrodes in the device 500 under testing and corresponds to different touch sensing regions in the device 500 under testing. It should be noted that, the conductive elements 42A to 42F of the touch simulation module 42 are not required to be in direct contact with the device 500 under testing. Given that the device 500 under testing can generate a capacitance change in response a testing signal of the conductive elements 42A to 42F placed closely to the device 500 under testing, an insulation layer may also be disposed between the conductive elements 42A to 42F and the device 500 under testing. Hence, it can be inferred that the conductive elements 42A to 42F need not be disposed at an outermost surface of the touch simulation module 42.

In an embodiment, the control module 44 selectively provides a testing signal to one or multiple of the conductive elements 42A to 42F according to actual testing requirements. For example, the testing signal may be at a ground potential or a potential close to the ground potential. Through the testing signal, the control module 44 sets one or multiple of the conductive elements 42A to 42F to ground or floating. When the control module 44 sets the conductive element 42A to ground, a situation that the touch sensing region covered by the conductive element 42A receives a user touch can be simulated in the device 500 under testing. Similarly, when the control module 44 sets the conductive elements 42D and 42F to ground, a situation that two touch sensing regions covered by the conductive elements 42D and 42F simultaneously receive a user touch can be simulated in the device 500 under testing.

In practice, a feasible testing procedure is to have the control module 44 to set the conductive elements 42A to 42F to ground in turn one after another. That is to say, the conductive element 42A is first set to ground while the remaining five conductive elements are set to floating, the conductive element 42B is next set to ground while the remaining five conductive elements are set to floating, and so forth.

The testing procedure employed by the control module 44 is known to the determination module 46. Thus, according to the sensing results generated under various testing conditions by the sensors 48, the determination module 46 determines whether the device 500 under testing correctly responds to the testings that the control module 44 applies to the touch sensing regions through the touch simulation module 42. Taking a leftmost triangular electrode in the device 500 under testing for example, when the conductive elements 42A to 42F are in turn set to ground, the capacitance change detected by the leftmost sensor 48 in the image theoretically becomes larger and larger, and corresponds to a covered area of the triangular electrode by each of the conductive elements 42A to 42F. If the determination module 46 discovers that the capacitance change detected by the leftmost sensor 48 in the image when the conductive element 42F is set to ground is smaller than a theoretical value, the determination module 46 may conclude that the covered area of the triangular electrode by the conductive element 42F may include a cutaway.

As such, the control module 44 can be designed to automatically control conduction statuses of the conductive elements without involving human resources. Compared to a conventional manual testing method, the testing system 400 offers outstanding efficiency for a testing range substantially covering all of the touch sensing regions in the device 500 under testing. Further, by incorporating an appropriately designed testing apparatus, relative positions of the testing system and the device under testing can be fixed to yield an accuracy far higher than that yielded by a manually placed metal rod. Given that a thickness of the conductive elements is designed to be noticeably lower than that of the metal rod, manufacturing material costs can be further lowered.

It should be noted that, the number and shape of the conductive elements are not limited to the examples shown in FIGS. 5A to 5C, and may be associated with actual testing requirements. For example, the shape of one conductive may be different from that of another, e.g., circles or irregular shapes in different sizes. Further, the surface of the touch simulation module 42 where the conductive elements are disposed is not necessarily a planar surface. For example, the surface of the touch simulation module 42 for disposing the conductive elements may be a curved plane with unevenness, and may be designed to adapt to an appearance of the device 500 under testing.

In the above embodiment, the determination module 46 determines whether the device 500 under testing correctly responds to the testing that the control module 44 performs through the touch simulation module 42 according to the capacitance change or the sensed capacitance detected by the sensors 48. In an alternative embodiment, the device 500 under testing may generate an output signal representing position information (e.g., two-dimensional coordinates) of a touch position, and determination and comparison basis of the determination module 46 may then correspondingly be designed as one or multiple coordinate theoretical values.

Figure 6:
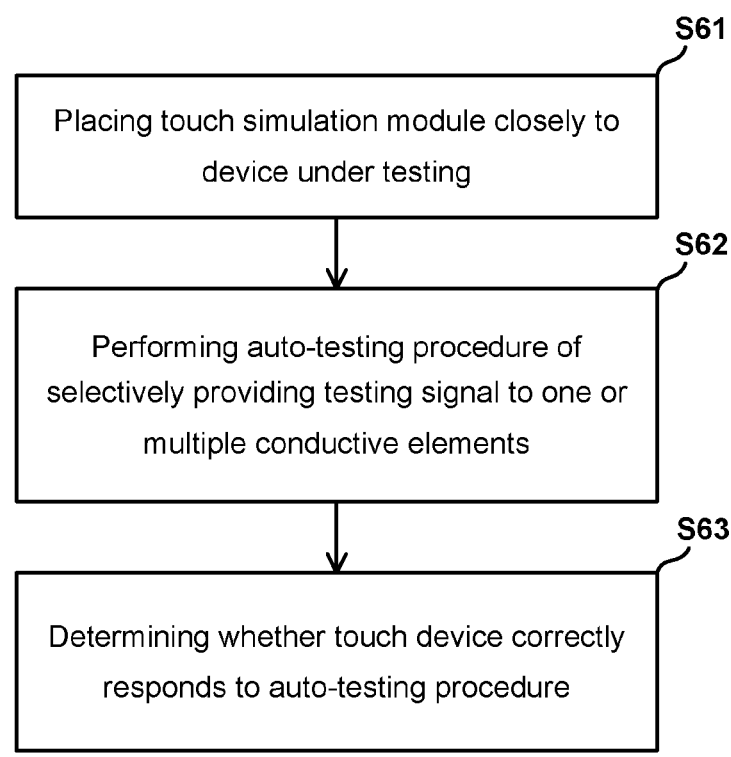
FIG. 6 is a flowchart of a testing method according to an embodiment of the present invention.

FIG. 6 shows a flowchart of a testing method according to another embodiment of the present invention. In step S61, a touch simulation module is placed closely to a device under testing. The touch simulation module includes multiple conductive elements respectively corresponding to multiple touch sensing regions of the device under testing. In step S62, an auto-testing procedure is performed to selectively provide a testing signal to one or multiple of the conductive elements. In step S63, it is determined whether the device under testing correctly responds to the auto-testing procedure. Operation details of the foregoing embodiment may be applied to the embodiment, and shall be omitted herein.

Therefore, the testing system and the testing method according to the embodiments of the present invention can be designed to be automatic without involving human resources. Compared to a conventional manual testing method, the testing system and the testing method disclosed by the present invention offer outstanding efficiency for a testing range substantially covering all touch sensing regions in a device under testing. Further, by incorporating an appropriately design testing apparatus, relative positions of the testing system and the device under testing can be fixed to yield an accuracy far higher than that yielded by a manually placed metal rod.

While the invention has been described by way of example and in terms of the preferred embodiments, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A touch device testing system for testing a touch device, comprising:
    a touch simulation module, comprising a plurality of conductive elements respectively corresponding to a plurality of touch sensing regions of the touch device, each conductive element spanning all sensing regions of the touch device along a predetermined axis;
    a control module, coupled to the conductive elements, for generating and selectively providing a testing signal to one or a plurality of conductive elements among the conductive elements; and
    a determination module, coupled to the touch device, for determining whether the touch device correctly responds to a testing that the control device applies to the touch sensing regions through the touch simulation module,
    wherein the plurality of conductive elements cause capacitances changes in the plurality of touch sensing regions in response to the testing signal.

2. The testing system according to claim 1, wherein the testing signal is at a ground potential.

3. The testing system according to claim 1, wherein the control module sequentially provides the testing signal to the conductive elements.

4. The testing system according to claim 1, wherein the conductive elements are a plurality of metal plates.

5. The testing system according to claim 1, wherein the conductive elements are disposed at a surface of the touch simulation module.

6. The testing system according to claim 1, wherein the touch device comprises a plurality of sensing electrodes of a self capacitive touch panel, and the touch sensing regions are formed by the sensing electrodes.

7. The testing system according to claim 6, wherein the determination module determines whether the touch device correctly responds to the testing according to a sensed capacitance or position information generated by the touch device.

8. The testing system according to claim 6, wherein the sensing electrodes have a planar shape similar to a scalene triangle, and a vertex and a base arranged in a staggered arrangement on a plane, with a shortest side of each of the sensing electrodes being parallel to a predetermined direction; the conductive elements are a plurality of strip-like conductive plates disposed in parallel; and when the touch simulation module is placed closely to the device under test to perform the testing, the strip-like conductive plates are also parallel to the predetermined direction.

9. A testing method for testing a touch device, comprising:
    a) applying a touch simulation module closely to the touch device, wherein the touch simulation module comprises a plurality of conductive elements respectively corresponding a plurality of touch sensing regions of the touch device, each conductive element spanning all sensing regions of the touch device along a predetermined axis;
    b) performing an auto-testing procedure of selectively generating and providing a testing signal to one or a plurality of conductive elements among the conductive elements; and
    c) determining whether the touch device correctly responds to the auto-testing procedure,
    wherein the plurality of conductive elements cause capacitances changes in the plurality of touch sensing regions in response to the testing signal.

10. The testing method according to claim 9, wherein the testing signal is at a ground potential.

11. The testing method according to claim 9, wherein step (b) sequentially provides the testing signal to the plurality of conductive elements among the conductive elements.

12. The testing method according to claim 9, wherein step (c) determines whether the touch device correctly responds to the auto-testing procedure according to a sensed capacitance or position information generated by the touch device.

* * * * *